(12) United States Patent
Imaeda et al.

(10) Patent No.: US 6,447,606 B2
(45) Date of Patent: *Sep. 10, 2002

(54) METHOD FOR PRODUCING A SINGLE-CRYSTALLINE FILM OF KLN OR KLNT

(75) Inventors: Minoru Imaeda, Nagoya; Takashi Yoshino, Aichi Pref., both of (JP)

(73) Assignee: NGK Insulators, Ltd., Nagoya (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/320,335

(22) Filed: May 26, 1999

(30) Foreign Application Priority Data

May 27, 1998 (JP) ............................................. 10-145613

(51) Int. Cl.⁷ .......................... C30B 28/12; C30B 29/30
(52) U.S. Cl. ...................... 117/108; 117/904; 117/918; 117/948
(58) Field of Search ................. 117/84, 92, 103, 117/904, 918, 948, 108

(56) References Cited

U.S. PATENT DOCUMENTS

| | | | |
|---|---|---|---|
| 4,740,265 A | | 4/1988 | Bierlein et al. ............. 156/624 |
| 5,145,713 A | | 9/1992 | Venkatesan et al. ....... 427/53.1 |
| 5,209,917 A | * | 5/1993 | Ohno et al. ................. 423/592 |
| 5,315,432 A | * | 5/1994 | Ohno ........................ 359/326 |
| 5,763,055 A | * | 6/1998 | Kawaguchi et al. ........ 428/195 |
| 5,785,898 A | * | 7/1998 | Hofmeister et al. ........ 252/584 |
| 5,985,404 A | * | 11/1999 | Yano et al. ................ 428/65.3 |

FOREIGN PATENT DOCUMENTS

| | | | |
|---|---|---|---|
| EP | 0 737 884 A | 10/1996 | ............. G02F/1/37 |
| EP | 0961160 A2 | * 12/1999 | ............. G02F/1/37 |
| EP | 09962809 A2 | * 12/1999 | ............. G02F/1/37 |
| JP | 05043398 | 2/1993 | ............ C30B/29/30 |
| JP | 05-043398 | * 2/1993 | ............ C30B/29/30 |
| JP | 09054347 | 2/1997 | ............. G02F/1/35 |

OTHER PUBLICATIONS

Adachi et al. "$K_3Li_2Nb_5O_{15}$ and $Pb_2KNb_5O_{15}$ Tungsten–Bronze films for SAW devices" Japanese Journal of Applied Physics, Supplements., vol. 20, No. 4, 1981, pp. 17–22, IP002114563, Japan Society of Applied Physics., Tokyo, JP, ISSN: 0021–4922.

Adachi et al. "Epitaxial growth of potassium lithium niobate single–crystal films on potassium bismuth niobate single crystals by RF sputtering" Japanese Journal of Applied Physics., vol. 17, No. 11, Nov. 1978 (1978–11), pp. 2053–2054, XP 002114562 Publication Office Japanese Journal of Applied Physics., Tokyo, JP, ISSN: 0021–4922.

* cited by examiner

*Primary Examiner*—Benjamin L. Utech
*Assistant Examiner*—Matthew Anderson
(74) *Attorney, Agent, or Firm*—Burr & Brown

(57) ABSTRACT

A method for producing a single-crystalline film made of a single crystal of lithium potassium niobate-lithium potassium tantalate solid solution or a single crystal of lithium potassium niobate, including the steps of preparing a target made of a material for the single-crystalline film, preparing a foundation made of a single crystal of lithium potassium niobate-lithium potassium tantalate solid solution or a single crystal of lithium potassium niobate, irradiating the target to gasify molecules constituting the target by dissociation and evaporation thereof, and epitaxially growing the single-crystalline film on the foundation.

12 Claims, 5 Drawing Sheets

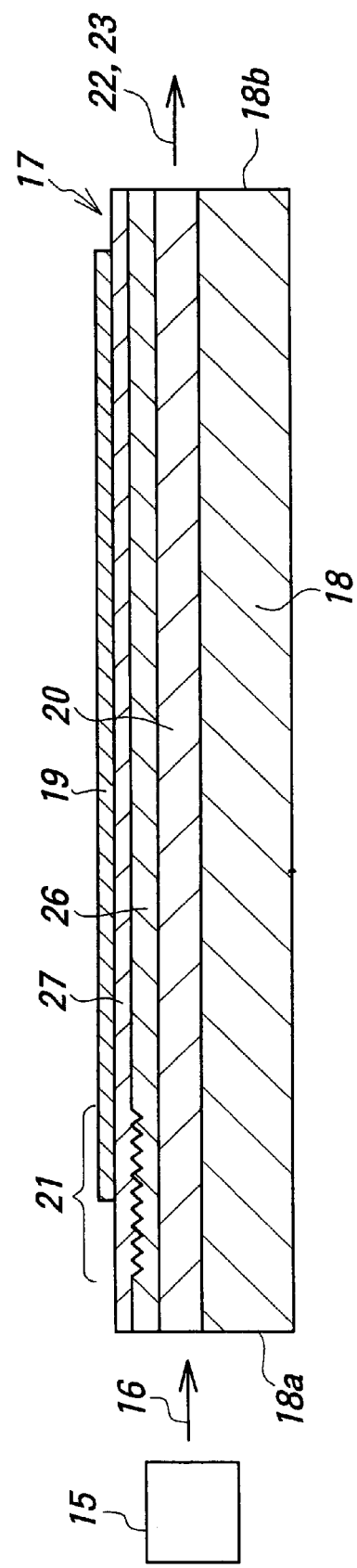

METHOD FOR PRODUCING A SINGLE-CRYSTALLINE FILM OF KLN OR KLNT

BACKGROUND OF THE INVENTION

1. Field of the Invention

This invention relates to a method for producing a single-crystalline film made of a single crystal of lithium potassium niobate-lithium potassium tantalate solid solution or a single crystal of lithium potassium niobate.

2. Related Art Statement

A device to generate a blue laser is suggested which is made by forming an optical waveguide having a periodically polarization-inversed structure and in which an infrared semiconductor laser is introduced into the optical waveguide (U.S. Pat. No. 4,740,265, JP-A-5-289131, and JP-A-5-173213). For example, JP-A-6-51359 discloses a second harmonic generation (SHG) device in which a polarization-inversed layer, an optical waveguide, a dielectric film, and a reflective grating layer are formed and a thickness of the dielectric film is defined to be a given value.

These techniques require high-precision control of domains in the crystalline film, which makes this techniques difficult to perform. An allowable temperature for the phase-matching must be controlled within a very precise range of ±0.5° C. Moreover, optical damage of the optical waveguide may be recognized at light energies of 3 mW and higher. Considering these phenomena, it is difficult to practice these techniques to manufacture practical devices.

On the other hand, NGK Insulators, Ltd. suggested in JP-A-8-339002 a SHG device having little optical damage without a quasi-phase-matching or controlling domains to a high-precision. In this literature, a film made of a single crystal of a lithium potassium niobate-lithium potassium tantalate solid solution (often called a "KLNT single crystal") or a single crystal of lithium potassium niobate (often called a "KLN single crystal") was grown by a liquid phase epitaxial growth method.

Furthermore, it is suggested that a single-layered film or a double-layered film made of a single crystal of a lithium potassium niobate-lithium potassium tantalate solid solution be formed on a substrate made of a single crystal of lithium potassium niobate by a metalorganic chemical vapor deposition method (MOCVD method) (JP-A-8-6083). Then, either one of these films is employed as an optical waveguide.

In the case of growing a film of a KLNT single crystal or a KLN single crystal by the above liquid phase epitaxial growth method, the melting point and the Curie temperature of the KLNT single crystal constituting a substrate are about 1000° C. and about 500° C., respectively. Thus, because growing a single crystal from a melt is required to be within a temperature range of not melting the substrate, the film actually has to be formed in a temperature range of 600° C. to 900° C. Accordingly, a composition range of the grown film is restricted. Moreover, because the film-forming temperature is normally 600° C. to 900° C. and higher than the Curie temperature of the substrate, the thus obtained film has a multi-domain structure. Therefore, after growing the single-crystalline film, the film has to be converted to a single domain structure by way of a single-poling step. However this single poling, a crystallinity of the single-crystalline film is to be on one deteriorated and a light propagation loss.

Furthermore, in the MOCVD method, considering decomposition-temperatures of an organic metal oxide of each of K, Li, and Nb, a film has to be formed in a temperature range of 500° C. to 800° C., so that the film has multi-domain structure. Consequently, the film has to be poled and thus crystallinity of the film is deteriorated.

SUMMARY OF THE INVENTION

It is an object of the present invention to obtain a single-crystalline film having small light-propagation loss, in a method for growing a KLN or a KLNT single-crystalline film.

The present inventors conceived that, by a laser ablation method, a laser is irradiated to a target made of a single crystal of lithium potassium niobate-lithium potassium tantalate solid solution, a single crystal of lithium potassium niobate solid solution or a sintered body comprising lithium, potassium, niobium, oxygen etc., and thereby molecules constituting the target were dissociated and evaporated to be gasified, and thereafter the single-crystalline film is epitaxially grown on a substrate made of a single crystal of lithium potassium niobate-lithium potassium tantalate solid solution or a single crystal of lithium potassium niobate solid solution. Consequently, the inventors found that the thus obtained film had excellent characteristics with not much light-propagation loss, and they reached this invention.

Generally, as a vapor phase growing method of a film of a single crystal, a MOCVD method, a MBE method, and a laser ablation method are known. As for the MOCVD method, many studies have been done and various film-formations have been carried out. On the contrary, the laser ablation is applied to a dielectric RAM memory which is produced by film-forming a PZT polycrystal on a silicon-semiconductor, but hardly applied to producing a film of single crystal oxide or producing a film of an optical single crystal.

As an example of applying the laser ablation method to optical single crystals or single crystal oxides, Kawai et al. tried to form a film of lithium niobate (LN) on a lithium tantalate-substrate or a sapphire-substrate (Appl. Phys. Lett. 61(8), 1000(1992), 62, 3046(1993)). However, the laser ablation method does not enable a film of LN having a small light-propagation loss usable for an optical waveguide to be obtained.

For example, a KLNT-single-crystalline film obtained according to the present invention has a higher conversion efficiency of SHG than a KLNT-single-crystalline film obtained according to a conventional MOCVD method does, by 30%, as the light-propagation loss in the single crystal film of the present invention is decreased.

The reason is not clear, but it is presumed that, even though the crystallinity of a substrate is substantially the same, since in the MOCVD method, heating the KLNT-substrate to a relatively high temperature under an oxidizing atmosphere causes lithium atoms and potassium atoms within the KLNT-substrate to be diffused outwardly toward the surface of the substrate and oxidized at this surface, and scattered from the surface, so that the crystallinity in the surface area of the substrate is deteriorated and characteristics of the single-crystalline film are influenced.

Moreover, according to the present invention, the single-crystalline film can be formed under the condition that the substrate is held within a temperature range of 200° C. to 600° C., particularly preferably 300° C. to 500° C. during the film formation. Consequently, poling treatment for the single-crystalline film is not required.

Furthermore, in a SHG element, for shortening a phase-matching wavelength of a KLNT-single-crystalline film or a KLN single-crystalline film and increasing its conversion efficiency, a single-crystalline material which is produced by doping rubidium into a KLNT- or a KLN-single crystal is demanded. However, since a rubidium-containing metalorganic compound to be easily handled is not known, a film of a single-crystalline material can not be practically formed by the MOCVD method. According to the present invention, since an oxide powdery mixture, a sintered body, or a single crystal can be freely selected as a target, a KLNT- or a KLN-single-crystalline film containing rubidium can be formed.

The method according to this invention is suitable for manufacturing optical parts, particularly an optical waveguide device. This method is preferred to produce an optical waveguide layer, but also an underclad layer and an overclad layer may be formed by this method.

Following the method of the present invention, the optical waveguide layer can be formed on the underclad layer, and the overclad layer can be formed on the optical waveguide layer. Moreover, following the method of the present invention, the underclad layer, the optical waveguide layer, and the overclad layer can be formed in turn. The term "underlayer" in this specification means an underlayer to form the single-crystalline film directly thereon according to the present invention. For example, the underlayer may be composed of the single-crystalline substrate, the underclad layer, or the optical waveguide layer.

BRIEF DESCRIPTION OF THE DRAWINGS

For a better understanding of this invention, reference is made to the attached drawings, wherein:

FIG. 3 is a side view schematically showing a part of the SHG device 17 in the above example, FIG. 4($a$) is a perspective view showing a part of a wavelength-converting optical waveguide in an enlarged scale (before forming a dielectric layer and a film heater), FIG. 4($b$) is a perspective view showing the same part as that in FIG. 4($a$) (after forming the dielectric layer and the film heater)

DETAILED DESCRIPTION OF PREFERRED EMBODIMENTS

Figure 1:
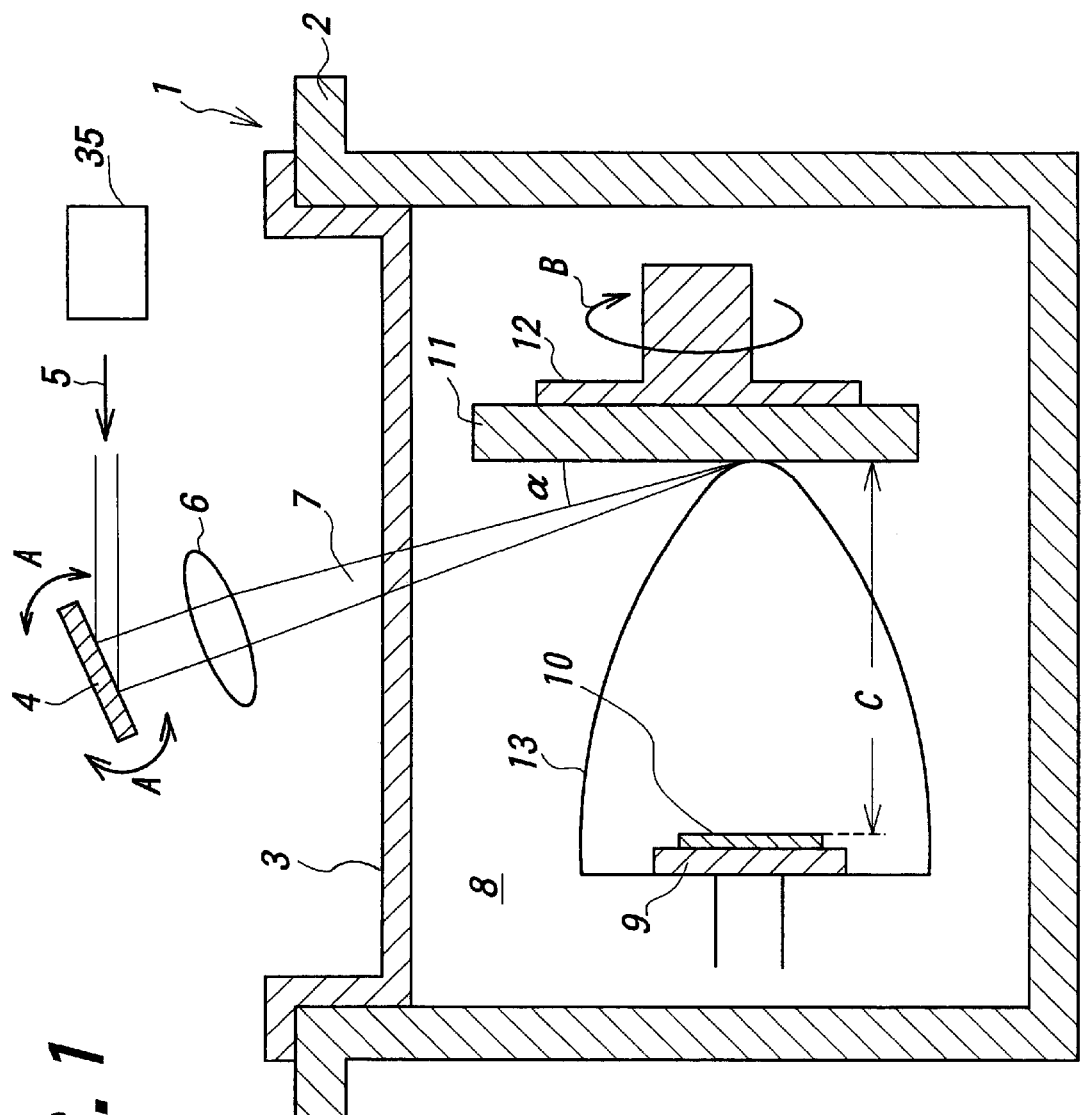
FIG. 1 is a schematic view showing a preferred embodiment of an equipment for carrying out a method of the present invention.

The single-crystalline substrate is preferably formed by a micro pulling-down method which is described in the specifications of JP-A-8-259375 and JP-A-8-319191 by the inventors.

In the case of forming an optical waveguide for generating a second harmonic wave from a fundamental wave constituting a SHG element according to the present invention, the optical waveguide preferably has a composition of a KLNT- or a KLN-single-crystalline material of $K_3Li_{2-2a}(Nb_{1-b}Ta_b)_{5+5c}O_{15-a+12.5c}$, hereupon, $-0.5 \leq a \leq 0.625$, $0 \leq b \leq 0.5$, $0.8 \leq (5-2a)/(5+5c) \leq 1.2$.

In this case, each of the substrate, the underclad layer, and the overclad layer is preferably a fundamental composition of $K_3Li_{2-2x}(Nb_{1-y}Ta_y)_{5+5z}O_{15-x+12.5z}$, hereupon, $-0.5 \leq x \leq 0.625$, $0 \leq y \leq 0.5$, $0.8 \leq (5-2x)/(5+5z) \leq 1.2$).

The term of $0.8 \leq (5-2x)/(5+5z)$, $(5-2a)/(5+5c) \leq 1.2$ may be rewritten as $(-1-2x)/6 \leq z \leq (1-2x)/4$ or $(-1-2a)/6 \leq c \leq (1-2a)/4$, respectively.

The reason why the above composition has the range of $-0.5 \leq a$, $x \leq 0.625$ is that the KLN or the KLNT material may take a tungsten bronze structure. If the amount of potassium in the material is larger than that in the above material having the composition of $-0.5 \leq a$, $x \leq 0.625$, the material becomes an ortho rhombic system of $KNbO_3$. If the amount of lithium in the material is larger than that in the above material having the composition, the material becomes a hexagonal system of $LiNbO_3$.

The reason why the above composition has the range of $0 \leq b$, $y \leq 0.5$ is that the Curie temperature decreases as the amount of substituted Ta in the material increases, and the Curie temperature approaches room temperature if b=0, y=0.5, so that the material does not have a ferroelectric property and does not generate a second harmonic wave.

The composition range of $0.8 \leq (5-2a)/(5+5c)$, $(5-2x)/(5+5z) \leq 1.2$ represents a range in which the single crystal having only the tungsten bronze structure can be obtained by controlling the ratio of (K+Li) to (Nb+Ta) in the pull-down method. The composition range, in which a uniform single crystal can be grown, is wider than that attainable by a Kyropoulos method.

In the above fundamental composition of the KLN or the KLNT material, a refractive index in the single crystal made of the material decreases as the amount of substituted Ta in the material increases and the value of "b" or "y" becomes large. Moreover, in the above fundamental composition, a refractive index in the single crystal increases as the amount of Nb in the material increases, that is, as the value of "c", or, "z" becomes large.

As the above fundamental composition, the above material having the tungsten bronze structure, made of K, Li, Nb, Ta, O element may be employed, but it is possible to substitute the element(s), for example to substitute Na, Rb, or the like for K, Li, or to dope a laser-generating doping element such as Cr, a rare earth series element of Er, Nd, or the like as far as the material maintains this structure.

The laser ablation is a method that a laser having the same energy as a binding energy among molecules constituting a material to be processed is irradiated to the material to decompose and evaporate the molecules. The wavelength of the laser is preferably 150 nm to 350 nm.

As a laser for processing the target, an excimer laser or a fourth harmonic wave of a Nd-YAG laser, etc. may be preferably employed. The excimer laser is a laser for repeatedly generating an ultraviolet pulse, in which ultraviolet rays generated from a gaseous compound such as ArF (a wavelength of 193 nm) or KrF(a wavelength of 248 nm) are taken out in an oscillating direction uninformalized with light-resonating equipment.

The special feature article of "An Excimer Laser in the Times of a practice use " in "O plus E", November, 1995, p64~108 is given as a literature reference with regard to an applied technique of the excimer laser.

FIG. 1 is a schematic diagram to explain an embodiment of the present invention. A chamber 1 comprises a chamber body 2 and a laser-penetrating window 3 attached to the chamber body 2. A target 11 is provided in the chamber 1 and attached to a rotating member 12. For example, a substrate 10 made of, for example, a single crystal is provided at the position opposite to the target 11 and is fixed on a heater 9.

A laser 5 is radiated from a laser source 35, and reflected by a rotating mirror 4, and passed through an optical system 6 to obtain a converged light 7. The converged light 7 is irradiated to the target 11 through the laser-penetrating window 3. At this time, the target 11 is rotated in a direction of an arrow B. Thereby, a vapor plume 13 is generated to spread toward the single-crystalline substrate 10. By controlling the temperature of the single-crystalline substrate 10, a single-crystalline film is formed on the substrate. By turning the rotating mirror 4 in a direction of an arrow A, an incident angle α of the converged light 7 to the target 11 is controlled.

A preferred embodiment of a SHG device which can be produced by the present invention, will be described hereinafter.

Figure 2:
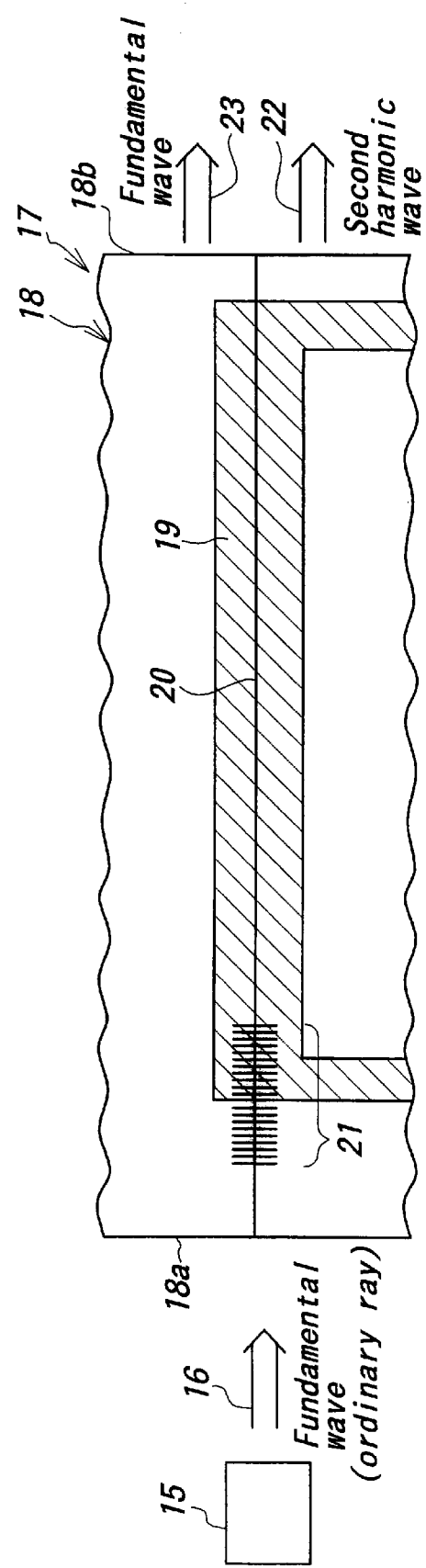
FIG. 2 is a plan view schematically showing a part of a SHG device 17 in an illustrative example of the present invention.

FIG. 2 to FIG. 5 show an embodiment in which a reflective grating part and a wavelength-converting optical waveguide are formed on an integral substrate. FIG. 2 is a plan view schematically showing a part of a SHG device 17 in this embodiment.

The SHG device 17 comprises a substrate 18 falling in, for example, a rectangular parallelepiped shape. The substrate 18 is preferably composed of a KLNT single crystal having the above composition range. Formed on a surface of the substrate 18, are a wavelength-converting optical waveguide 20 and a reflective grating part 21, on which a film heater 19 is formed. Hereupon, FIG. 2 schematically shows the positions of 19, 20, 21 in plane. A reference numeral 15 denotes a laser source.

A fundamental wave (an ordinary ray) 16 is led through an incident end 18a of the substrate 18. The fundamental wave 16 is led into the optical waveguide 20 and passed through the reflective grating part 21. During the passage, a part of the fundamental wave 16 is returned from the reflective grating part to fix its wavelength. The generated heat from the film heater 19 almost never changes a refractive index of an ordinary ray in the optical waveguide 20 under the reflective grating part 21, and hardly influences an intensity of the light with the fixed wavelength. Moreover, by operating the film heater 19, the refractive index of an extraordinary ray in the optical waveguide can be increased. Thereby, the wavelength of a second harmonic wave 22 can be controlled dynamically, and the output of the second harmonic wave can be increased and optimized. A reference numeral 23 denotes an ordinary ray leaving from a substrate-end 18b of the optical waveguide.

Hereupon, a filmy heat-absorbing member as a Peltier element may be provided instead of the film heater 19.

Figure 4A:
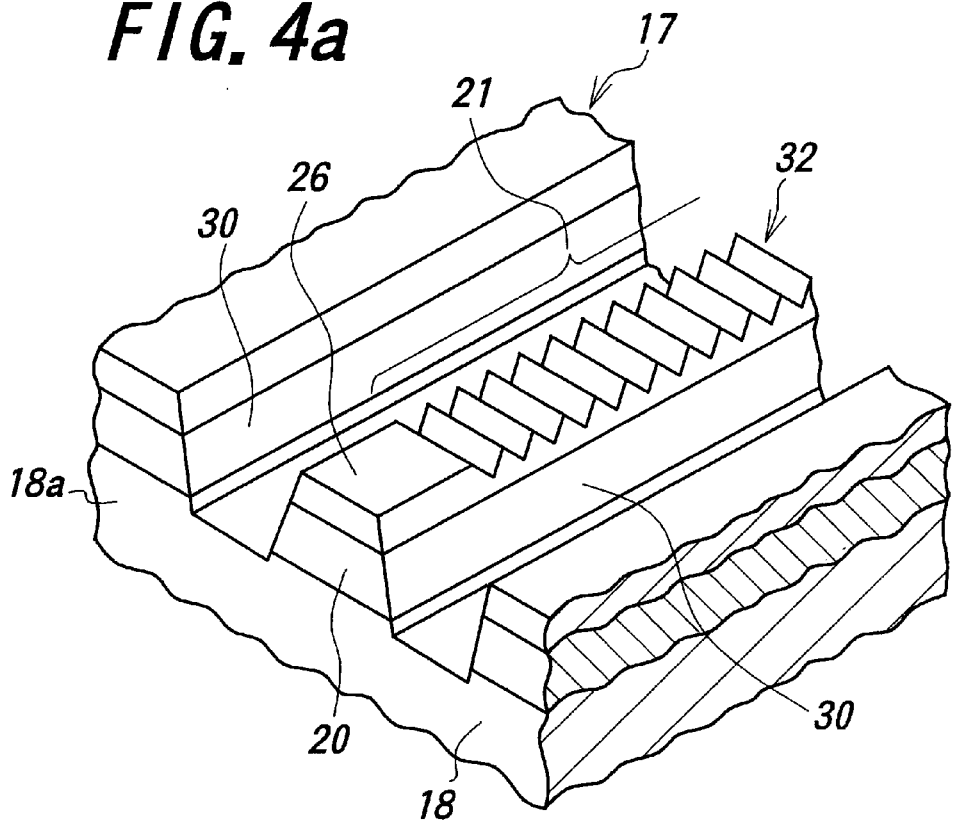
Figure 4B:
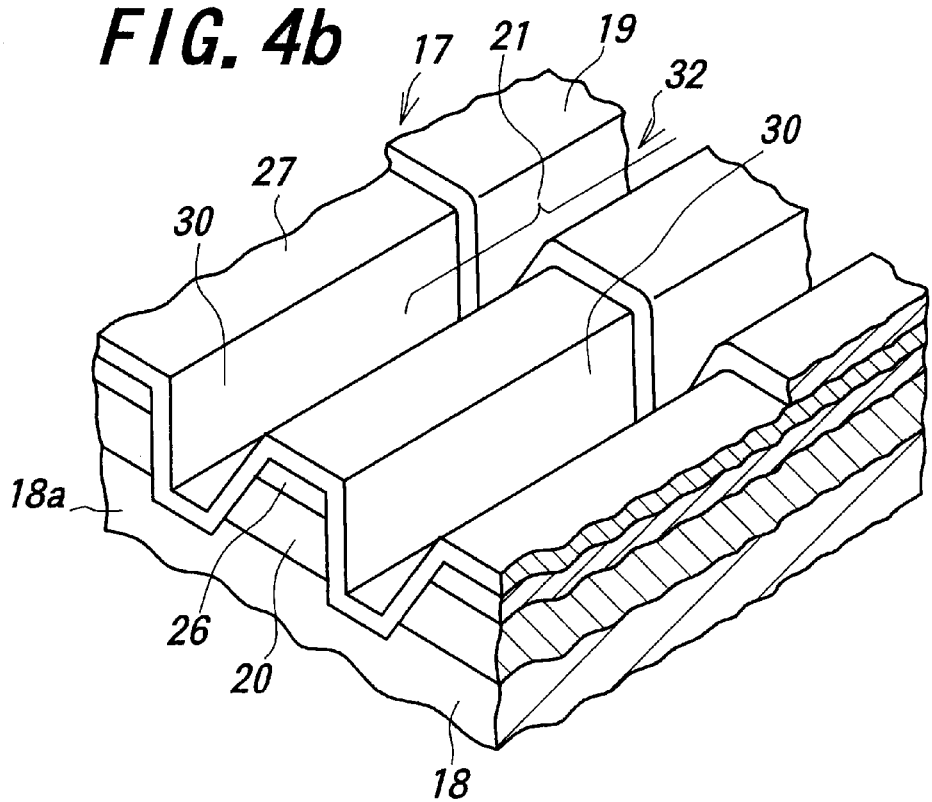
Figure 5:
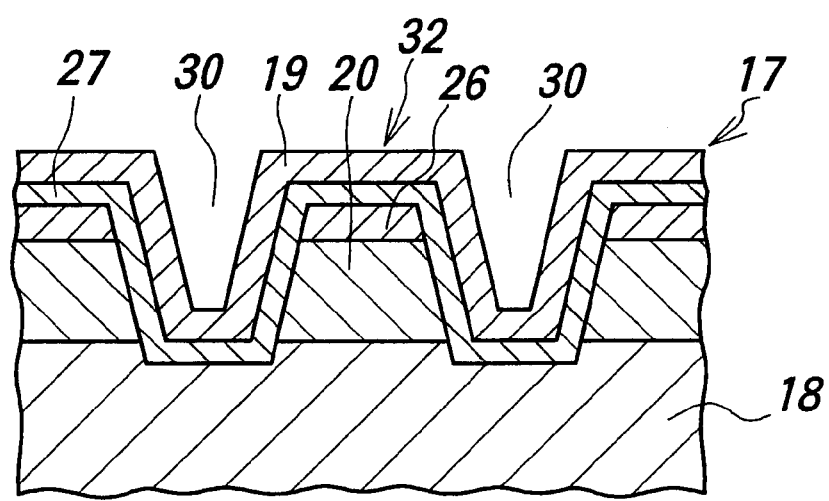
FIG. 5 is a transverse sectional view of FIG. 4($b$).

With reference to FIG. 3 to FIG. 5, a preferred embodiment of the device 17 shown in FIG. 2 will be described hereinafter. FIG. 3 to FIG. 5 show one embodiment of the device 17 illustrated in FIG. 2, FIG. 3 being a side view schematically showing the SHG device 17, FIG. 4(a) being a perspective view showing a part of the wavelength-converting optical waveguide in an enlarged scale (before forming a dielectric layer and the film heater), FIG. 4(b) being a perspective view showing the similar part to that in FIG. 4(a) (after forming the dielectric layer and the film heater), and FIG. 5 is a transverse sectional view of FIG. 4(b).

Formed on a surface of a single-crystalline substrate 18, is a ridge-type wavelength-converting optical waveguide 20, on which an overclad layer 26 is formed. Ditches constituting a diffraction grating with a uniform periodic pitch, which composes a reflective grating part 21, are formed in the overclad layer 26 by, for example, a reactive ion etching method.

A dielectric layer 27 is formed to cover the ridge-type optical waveguide 20 and the overclad layer 26. A film heater 19 is formed in a given area on the dielectric layer 27. Ridge type structures 32 are composed of the wavelength-converting optical waveguide 20, the overclad layer 26, and the dielectric layer 27. Slender ditches 30 are formed in both sides of the ridge-type structure 32.

Although a material composing the dielectric layer is not limited, $Ta_2O_5$, $SiO_2$, $TiO_2$, $HfO_2$, or $Nb_2O_5$ is preferably employed. As a material composing the film heater, Ni, Ti, Ta, Pt, or Cr is preferably employed. Instead of the film heater, a Peltier element may be used.

According to the producing method of the present invention, the optical waveguide 20 and/or the overclad layer 26 may be formed. In this case, after forming the optical waveguide 20 by the metalorganic vapor phase epitaxial method, the overclad layer 26 may be formed by the method according to the present invention.

EXAMPLE

The invention will be explained in more detail with reference to the following examples.

EXAMPLE

Production of a KLNT Single-crystalline Substrate

In this example, a KLNT single-crystalline substrate was produced according to a method shown in JP-A-8-339002. Concretely, powdery potassium carbonate, lithium carbonate, niobium oxide, and tantalum oxide were mixed at a composition ratio of 30:20:48:2 to obtain a powdery raw material. About 50 g of the powdery raw material was put into a planer crucible made of platinum (a thickness of 1 mm and a width of 50 mm) and the crucible was set in a given position in a furnace. The powdery raw material in the crucible was melted, while an upper space in the furnace was controlled to a temperature range of 1100° C. to 1200° C. A KLNT single-crystalline substrate having a "C" crystal face could be successfully pulled down in a direction of an "a" axis thereof at the rate of 20 mm/hour, while the temperature of a single crystal growing part was set to a temperature range of 1050° C. to 1150° C.

A composition of the thus obtained single-crystalline substrate was $K_3Li_2(Nb_{0.96}Ta_{0.04})_5O_{15}$. The single-crystalline substrate had a length of 50 mm, a width of 50 mm, and a thickness of 1 mm. Electrodes of platinum were formed on both of the main surfaces of the single-crystalline substrate, respectively. After heating the substrate up to 600° C. in an electric furnace, DC voltage was applied to the electrodes and thereby the substrate was changed to single domain structure.

Production of a KLN Single-crystalline Film (an Optical Waveguide Layer)

A KLN single-crystalline film growth was done in the equipment shown in FIG. 1, on the thus obtained substrate, which was employed as the substrate 10. Concretely, as the target 11, a disk-like sintered body with a diameter of 30 mm and a thickness of 5 mm having a composition of $K_6Li_4Nb_5O$ was employed. The penetrating window 3 was made of quartz.

An ArF eximer laser with a wavelength of 193 nm was focused into the chamber 1 through the penetrating window 3 and irradiate to the sintered body. A KLN single-crystalline film was formed on the single-crystalline substrate 10 at a substrate-temperature of 450° C. under a pressure of about 50 mtorr in an atmosphere 8 of the chamber 1, a pulse-width of the laser being 10 ns, a frequency of the laser being 10 Hz, an incident angle α being 17 degree, an intensity of the laser being 30 mJ/cm², and a distance between the target and the single-crystalline substrate being 50 mm. Consequently, a film having a composition of $K_3Li_2Nb_5O_{15}$ was formed on the single-crystalline substrate. Hereupon, the growth rate of the film was 1.5 μm/hour, and the thickness of the film was about 5 μm and had uniformity over the entire film.

Evaluations of characteristics of the single-crystalline film revealed that the film had a composition capable of phase-matching at a wavelength of 850 nm of an incident light and no deviation in the refractive index in a direction parallel to its surface observed within a measurement precision. The film was processed to a thickness of 4.0±0.2 μm by mirror polishing.

Production of a Ridge-type Three-dimensional Optical Waveguide

After forming the above single-crystalline film, a mask of titanium having a shape to obtain a linear optical waveguide with a width of 4 μm was formed on the single crystalline film by a lift-off process. The thickness of the mask was 6000 Å. Then, the single-crystalline film was RF plasma-etched with Ar ions to form a ridge-type three-dimensional linear optical waveguide having a width of 4 μm and a height of 3 μm. The conditions were, an RF output being 200 W, a pressure of Ar gas being 0.08 Pa, and a etching rate being 10 nm/min.

A Measurement of a a Second Harmonic Wave-generating Efficiency

The single-crystalline substrate having the ridge-type optical waveguide was cut out in a length of 7 mm and a width of 2 mm as viewed in a direction alongside the optical waveguide to obtain chips. Then, both ends of each of the chips were optically polished. From one of the above substrates, 175 chips were cut out in a width of 25 mm and a length of 7 mm. A semiconductor laser unit (an output of 150 mW) with a wavelength of 850 nm was directly coupled to one end of each chip, and a laser was led into the optical waveguide in a TE mode, and the output of a blue second harmonic wave with a wavelength of 425 nm leaving from its other end was measured.

Consequently, an output of about 20 mW was obtained in a single mode. At that time, no optical damage in the optical waveguide was completely recognized. The fluctuation in the phase-matching wavelength and that in the output in all chips were not more than 0.05 nm and within a range of ±2%, respectively. Thus, the producing method in this example was found to be excellent as a method of producing a practical device.

Film-formation by the Metalorganic Vapor Phase Epitaxial Method and Estimation of a Second Harmonic Wave-generating Efficiency An optical waveguide having a composition of $K_3Li_2Nb_5O_{15}$ was formed on the above single-crystalline substrate by the metalorganic vapor is zphase epitaxial method under the conditions of a temperature of the single-crystalline substrate being 750° C., a pressure inside a reactor tube being 20 Torr, and a film-forming rate being 0.8 μm/hour. Thereby, an optical waveguide layer was obtained in a thickness of 2.5 μm.

The optical waveguide layer was processed by the reactive ion etching method to form a ridge-type three-dimensional optical waveguide having a width of 5 μm and a thickness of 3 μm.

A second harmonic wave-generating efficiency in the thus obtained sample was measured as above-mentioned. As a result, an output of about 15 mW was obtained in a single mode. In the output, an optical loss in the optical waveguide formed on the single-crystalline substrate was 0.5 dB. The fluctuation of a phase-matching wavelength and that of the output in all chips were not more than 0.5 nm and within a range of ±5%, respectively.

As above-mentioned, according to the present invention, in a method for growing a kln or a klnt single-crystalline film, a single-crystalline film with little light propagation loss can be obtained without forming a multi-domain structure.

What is claimed is:

1. A method for producing a single-crystalline film for an optical waveguide device, said film being made of a single crystal of lithium potassium niobate-lithium potassium tantalate solid solution or a single crystal of lithium potassium niobate, both having a tungsten-bronze structure, said method comprising the steps of:

preparing a target made of a material for said single-crystalline film;

preparing a foundation made of a single crystal of lithium potassium niobate-lithium potassium tantalate solid solution or a single crystal of lithium potassium niobate;

irradiating the target with a laser beam to gasify molecules constituting the target by dissociation and evaporation thereof; and epitaxially growing the single-crystalline film on the foundation;

whereby the single-crystalline film has a substantially single-domain structure without requiring poling treatment.

2. The producing method claimed in claim 1, wherein the foundation is composed of a single-crystalline substrate which is made by a micro pulling-down method.

3. The producing method claimed in claim 1, wherein the material constituting the target is a single crystal of lithium potassium niobate-lithium potassium tantalate solid solution or a single crystal of lithium potassium niobate.

4. The producing method claimed in claim 1, wherein the material constituting the target is a sintered body.

5. The producing method claimed in claim 1, wherein the material constituting the target is a sintered body and the single-crystalline film is an optical waveguide layer.

6. The producing method claimed in claim 1, wherein the material constituting the target is a sintered body and the single-crystalline film is an underclad layer or an overclad layer.

7. The producing method claimed in claim 2, wherein the material constituting the target is a single crystal of lithium potassium niobate-lithium potassium tantalate solid solution or a single crystal of lithium potassium niobate.

8. The producing method claimed in claim 2, wherein the material constituting the target is a sintered body.

9. The producing method claimed in claim 2, wherein the material constituting the target is a sintered body and the single-crystalline film is an optical waveguide layer.

10. The producing method claimed in claim 2, wherein the material constituting the target is a sintered body and the single-crystalline film is one of an underclad layer or an overclad layer.

11. The producing method of claim 1, further comprising the step of heating the foundation at a temperature within the range of 200° C.–600° C.

12. The producing method of claim 1, further comprising the step of heating the foundation at a temperature within the range of 300° C.–500° C.

* * * * *